(12) United States Patent
Fukuda et al.

(10) Patent No.: US 11,445,607 B2
(45) Date of Patent: Sep. 13, 2022

(54) RELAY CIRCUIT BOARD, ELECTRIC WIRE FOR DIFFERENTIAL TRANSMISSION WITH RELAY CIRCUIT BOARD, CABLE WITH CONNECTOR

(71) Applicant: SUMITOMO ELECTRIC INDUSTRIES, LTD., Osaka (JP)

(72) Inventors: Keiichiro Fukuda, Kanuma (JP); Masaki Oyagi, Kanuma (JP); Toru Nakanishi, Kanuma (JP); Wataru Sakurai, Kanuma (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 12 days.

(21) Appl. No.: 16/943,106

(22) Filed: Jul. 30, 2020

(65) Prior Publication Data
US 2020/0359497 A1 Nov. 12, 2020

Related U.S. Application Data

(63) Continuation of application No. PCT/JP2019/029285, filed on Jul. 25, 2019.

(30) Foreign Application Priority Data

Sep. 4, 2018 (JP) .............................. JP2018-165444

(51) Int. Cl.
  *H05K 1/11* (2006.01)
  *H01R 12/53* (2011.01)
(52) U.S. Cl.
  CPC ............. *H05K 1/117* (2013.01); *H01R 12/53* (2013.01); *H05K 2201/09027* (2013.01); *H05K 2201/09409* (2013.01)

(58) Field of Classification Search
  CPC ........................................................ H05K 1/117
  USPC .............................................................. 439/676
  See application file for complete search history.

(56) References Cited

U.S. PATENT DOCUMENTS

| | | | |
|---|---|---|---|
| 6,183,302 B1 | 2/2001 | Daikuhara et al. | |
| 6,361,367 B1 | 3/2002 | Daikuhara et al. | |
| 6,371,812 B1 | 4/2002 | Daikuhara et al. | |
| 2002/0002004 A1 | 1/2002 | Akama et al. | |
| 2002/0009906 A1 | 1/2002 | Akama et al. | |
| 2004/0002262 A1 | 1/2004 | Murayama et al. | |
| 2004/0166723 A1 | 8/2004 | Kumamoto et al. | |
| 2009/0221164 A1 | 9/2009 | Kobayashi et al. | |
| 2009/0277665 A1 | 11/2009 | Kumamoto et al. | |
| 2009/0305551 A1* | 12/2009 | Kameda ............. | H01R 13/6471 439/497 |

(Continued)

FOREIGN PATENT DOCUMENTS

| | | | |
|---|---|---|---|
| CN | 107484332 A | | 12/2017 |
| JP | 2000 187452 | * | 12/1998 |

(Continued)

*Primary Examiner* — Stanley Tso
(74) *Attorney, Agent, or Firm* — Oliff PLC (57) ABSTRACT

A relay circuit board includes: a plurality of first pads arranged in parallel in a first direction; a plurality of second pads arranged in parallel in a second direction; and wirings connecting the plurality of first pads and the plurality of second pads, respectively.

The second direction is inclined at a predetermined angle with respect to the first direction, and the predetermined angle is greater than 0 degree and smaller than 90 degrees.

8 Claims, 5 Drawing Sheets

(56) References Cited

U.S. PATENT DOCUMENTS

| | | |
|---|---|---|
| 2011/0143579 A1 | 6/2011 | Karabatsos |
| 2011/0294356 A1* | 12/2011 | Mizukami ............ H01R 12/724 |
| | | 439/660 |
| 2012/0178292 A1 | 7/2012 | Kumamoto et al. |
| 2020/0359497 A1 | 11/2020 | Fukuda et al. |

FOREIGN PATENT DOCUMENTS

| | | | |
|---|---|---|---|
| JP | 2000-068006 | A | 3/2000 |
| JP | 2000-068007 | A | 3/2000 |
| JP | 2000-123893 | A | 4/2000 |
| JP | 2000-187452 | A | 7/2000 |
| JP | 2004-031257 | A | 1/2004 |
| JP | 2004-253272 | A | 9/2004 |
| JP | 2009-042777 | A | 2/2009 |
| JP | 2009-182294 | A | 8/2009 |
| JP | 2009-205972 | A | 9/2009 |
| JP | 2009-272247 | A | 11/2009 |
| JP | 2010-108672 | A | 5/2010 |
| JP | 2010-113813 | A | 5/2010 |
| JP | 2010-130274 | A | 6/2010 |
| JP | 2012-142245 | A | 7/2012 |
| JP | 2017-503313 | T | 1/2017 |
| WO | 2015-088636 | A1 | 6/2015 |

\* cited by examiner

RELAY CIRCUIT BOARD, ELECTRIC WIRE FOR DIFFERENTIAL TRANSMISSION WITH RELAY CIRCUIT BOARD, CABLE WITH CONNECTOR

CROSS-REFERENCE TO RELATED APPLICATION(S)

This application is a continuation of PCT application No. PCT/JP2019/029285, which was filed on Jul. 25, 2019 based on Japanese Patent Application No. 2018-165444 filed on Sep. 4, 2018, the contents of which are incorporated herein by reference.

TECHNICAL FIELD

The present disclosure relates to a relay circuit board, an electric wire for differential transmission with a relay circuit board, and a cable with a connector.

BACKGROUND

Patent Literature 1 (JP-A-2000-68007), Patent Literature 2 (JP-A-2004-31257), and Patent Literature 3 (JP-A-2004-253272) disclose a connector with a cable including a relay circuit board. The relay circuit board is provided with pads (wire pads) at which a plurality of wires provided in the cable are soldered, and pads (connector pads) that are connected to pins of the connector.

The wire pads and the connector pads are provided in parallel in a direction orthogonal to a longitudinal direction of a cable, and a wiring between the wire pad and the connector pad is formed in a linear shape.

Patent Literature 4 (JP-A-2009-205972) discloses a right-angle socket connector applied in an electronic device (communication apparatus or the like) for connecting a cable to a printed circuit board in the electronic device.

SUMMARY

A relay circuit board according to an aspect of the present disclosure includes:
a plurality of first pads arranged in parallel in a first direction;
a plurality of second pads arranged in parallel in a second direction; and
wirings connecting the plurality of first pads and the plurality of second pads, respectively.
The second direction is inclined at a predetermined angle with respect to the first direction, and
the predetermined angle is greater than 0 degree and smaller than 90 degrees.

An electric wire for differential transmission with a relay circuit board according to an aspect of the present disclosure includes:
a relay circuit board including a plurality of first pads arranged in parallel in a first direction, a plurality of second pads arranged in parallel in a second direction, and wirings connecting the plurality of first pads and the plurality of second pads, respectively; and
a plurality of electric wires for differential transmission.
The plurality of electric wires for differential transmission are respectively connected to the plurality of first pads,
the second direction is inclined at a predetermined angle with respect to the first direction, and the predetermined angle is greater than 0 degree and smaller than 90 degrees.

A cable with a connector according to an aspect of the present disclosure includes:
a connector; and
a cable.
The connector includes:
a relay circuit board including a plurality of first pads arranged in parallel in a first direction, a plurality of second pads arranged in parallel in a second direction, and wirings connecting the plurality of first pads and the plurality of second pads, respectively;
a housing accommodating the relay circuit board; and
a plurality of connector terminals arranged in parallel in the second direction, and
the plurality of second pads are connected to the plurality of connector terminals.
The cable includes a plurality of electric wires for differential transmission, and is led out from the housing in a state in which the plurality of electric wires for differential transmission are bundled,
the plurality of electric wires for differential transmission are respectively connected to the plurality of first pads,
the second direction is inclined at a predetermined angle with respect to the first direction, the predetermined angle is greater than 0 degree and smaller than 90 degrees, and
the second direction and the direction in which the cable is lead out from the housing are the same direction.

DESCRIPTION OF EMBODIMENTS

Technical Problem to be Solved

In order to transmit high-speed signals, differential transmission using a pair of (two) wires is suitable. However, when lengths of the pair of electric wires are not made uniform, that is, when the lengths are not equal to each other, it is difficult to obtain stable differential transmission.

The connector in the connector with cable of Patent Literatures 1 to 3 has a so-called straight structure in which connector terminals are provided from a connection portion of a cable linearly in the longitudinal direction of the cable, and the wirings in the relay circuit board are wired in straight line as described above. Therefore, the wirings in the relay circuit board can be arranged at equal lengths.

Patent Literature 4 describes a right-angle socket connector. The connector with cable to be connected to the electronic device is also considered to be a right-angle type. The right-angle connector with cable is provided with connector terminals, for example, at positions perpendicular to the longitudinal direction (right angle) of the cable from a connection portion of a cable.

However, in order to make the connector with cable using the relay circuit board to be a right-angle connector, it is necessary to bend the wirings of the relay circuit board from the wire pads to the connector pads by 90 degrees. Therefore, in the relay circuit board of the right-angle connector with cable, in order to prevent a wire length difference in a pair of wirings for transmitting differential signals, a wiring that is bent in a meandering manner called meander wiring is used. Since a region of the meander wiring on the relay circuit board has more wasteful space than a region of the simple wiring, an area of the relay circuit board is increased when the meander wiring is used. Further, when a plurality of wire pads are arranged at high density, since the simple wiring is not sufficient, it is necessary to provide many meander wirings, so that the area of the relay circuit board is further increased. As described above, when the area of the relay circuit board increases, a housing of the connector also increases.

Although it is also conceivable to reduce the meander wiring by making the relay circuit board multilayer and leading the wiring to a lower layer through a through hole and an interlayer via, loss of signals is increased by making the wiring pass through the through hole or the interlayer via, which is disadvantageous to transmission of high-speed signals.

An object of the present disclosure is to provide a relay circuit board, a wire with a relay circuit board, and a cable with connectors in which a dead space in a connector can be reduced while eliminating a wire length difference between a pair of wirings for differential transmission without increasing an area of the relay circuit board as much as possible.

Advantageous Effects of the Present Disclosure

According to the present disclosure, the dead space in the connector can be reduced while eliminating the wire length difference between a pair of wirings for differential transmission without increasing the area of the relay circuit board as much as possible.

Description of Embodiments of Present Disclosure

First, embodiments of the present disclosure will be listed and described.

(1) A relay circuit board according to an aspect of the present disclosure includes:
a plurality of first pads arranged in parallel in a first direction;
a plurality of second pads arranged in parallel in a second direction; and
wirings connecting the plurality of first pads and the plurality of second pads, respectively.
The second direction is inclined at a predetermined angle with respect to the first direction, and
the predetermined angle is greater than 0 degree and smaller than 90 degrees.

According to the above configuration, the plurality of first pads arranged in parallel are inclined with respect to the plurality of second pads arranged in parallel, respectively. Thus, it possible to reduce, as much as possible, a region in which a meander wiring for absorbing a wire length difference between a pair of wirings for differential transmission is formed without bending the wires connected to the first pads as much as possible. Therefore, a dead space in a connector generated when a relay circuit board is used in the connector can be reduced while eliminating a wire length difference between a pair of wirings for differential transmission without increasing the area of the relay circuit board as much as possible.

(2) The predetermined angle may be 30 degrees or greater and 60 degrees or smaller.

According to the above configuration, design of the wiring in the relay circuit board can be further facilitated, and manufacturing of the relay circuit board can be further facilitated.

(3) An electric wire for differential transmission with a relay circuit board according to an aspect of the present disclosure includes:
a relay circuit board including a plurality of first pads arranged in parallel in a first direction, a plurality of second pads arranged in parallel in a second direction, and wirings connecting the plurality of first pads and the plurality of second pads, respectively; and
a plurality of electric wires for differential transmission.
The plurality of electric wires for differential transmission are respectively connected to the plurality of first pads,
the second direction is inclined at a predetermined angle with respect to the first direction, and the predetermined angle is greater than 0 degree and smaller than 90 degrees.

According to the above configuration, in the relay circuit board, the plurality of first pads arranged in parallel are inclined with respect to the plurality of second pads arranged in parallel. Thus, it possible to reduce, as much as possible, the region on which the meander wiring for absorbing the wire length difference between a pair of wirings for differential transmission is formed without bending the wires connected to the first pads as much as possible. Therefore, the dead space in the connector generated when a relay circuit board is used in the connector can be reduced while eliminating the wire length difference between a pair of wirings for differential transmission without increasing the area of the relay circuit board as much as possible.

(4) A cable with a connector according to an aspect of the present disclosure includes:
a connector; and
a cable.
The connector includes:
a relay circuit board including a plurality of first pads arranged in parallel in a first direction, a plurality of second pads arranged in parallel in a second direction, and wirings connecting the plurality of first pads and the plurality of second pads, respectively;
a housing accommodating the relay circuit board; and
a plurality of connector terminals arranged in parallel in the second direction, and
the plurality of second pads are connected to the plurality of connector terminals.
The cable includes a plurality of electric wires for differential transmission, and is led out from the housing in a state in which the plurality of electric wires for differential transmission are bundled,
the plurality of electric wires for differential transmission are respectively connected to the plurality of first pads,
the second direction is inclined at a predetermined angle with respect to the first direction, the predetermined angle is greater than 0 degree and smaller than 90 degrees, and
the second direction and the direction in which the cable is lead out from the housing are the same direction.

According to the above configuration, in the relay circuit board, the plurality of first pads arranged in parallel are inclined with respect to the plurality of second pads arranged in parallel. Thus, it possible to reduce, as much as possible, the region on which the meander wiring for absorbing the wire length difference between a pair of wirings for differential transmission is formed without bending the wires connected to the first pads as much as possible. Therefore, the dead space in the housing can be reduced while eliminating the wire length difference between a pair of wirings for differential transmission without increasing the area of the relay circuit board as much as possible. Therefore, in a cable with a so-called right-angle connector in which the direction in which the plurality of connector terminals are arranged in parallel and the direction in which the cable is led out from the housing are the same direction, the connector can be reduced in size.

Details of Embodiments of Present Disclosure

Specific examples of a relay circuit board, an electric wire for differential transmission with a relay circuit board, and a cable with a connector according to embodiments of the present disclosure will be described with reference to the drawings.

The present invention is not limited to the exemplary embodiments and is defined in the claims, and includes all changes within the equivalent meaning and scope to the claims.

Figure 1:
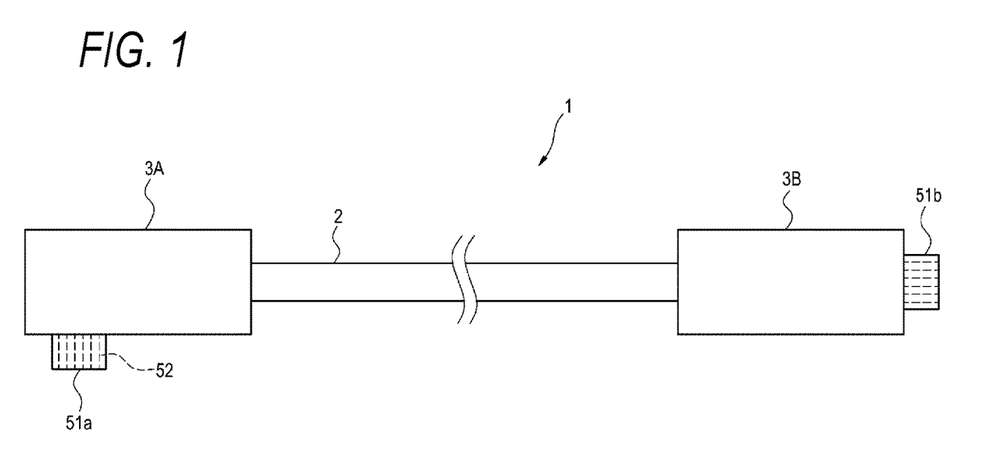
FIG. 1 is a schematic diagram illustrating an appearance of an example of a cable with connectors according to an embodiment of the present disclosure.

FIG. 1 is a schematic diagram illustrating an appearance of an example of a cable with connectors according to an embodiment of the present disclosure.

As illustrated in FIG. 1, a cable 1 with connectors includes a cable 2 and connectors 3A and 3B connected to both ends of the cable 2.

The cable 2 is a multi-core cable having a configuration in which a plurality of wires are covered by a cable jacket. The connector 3A connected to one end portion of the cable 2 is a right-angle connector having a connection portion 51a protruding to a side opposite to a connection side with the cable 2. The connector 3B connected to the other end portion of the cable 2 is a straight connector having a connection portion 51b protruding to a length direction of the cable 2 on a side opposite to a connection side with the cable 2. In addition to the above configuration, for example, the cable 1 with connectors may have a configuration in which right-angle connectors are connected to both ends of the cable 2.

The cable 1 with connectors can be used, for example, as a cable for connecting apparatuses of Factory Automation (FA) to each other, or as a cable for connecting an electronic device, a mobile terminal, or the like to another apparatus.

Figure 2:
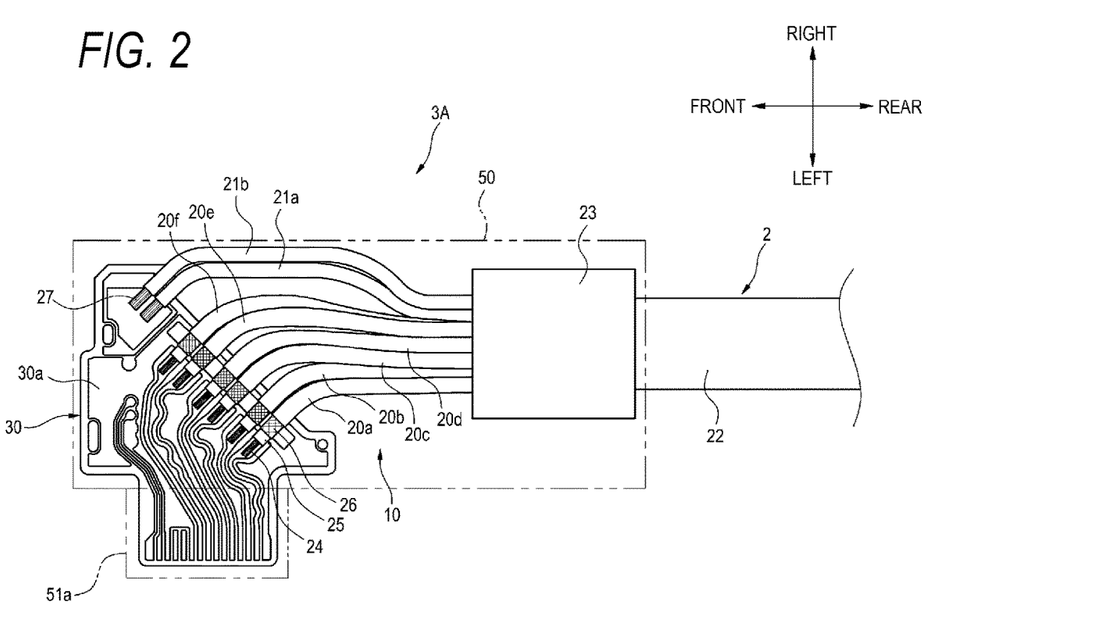
FIG. 2 is a view of an interior of a connector at one end of the cable with connectors of FIG. 1 as viewed from a front surface side.

FIG. 2 is a view of an interior of the connector 3A in the cable 1 with connectors of FIG. 1 as viewed from a front surface side.

As illustrated in FIG. 2, the connector 3A includes a housing 50, and the connection portion 51a protruding laterally is provided to configure a part of the housing 50. In the housing 50, an electric wire for differential transmission with relay circuit board 10 is provided which includes a relay circuit board 30 and ends of the cable 2 (including coaxial wires 20a to 20f or the like). A plurality of connector terminals 52 are provided inside the connection portion 51a (with reference to FIG. 1). The cable 2 and the connector terminals 52 are connected to the relay circuit board 30 in the housing 50, respectively.

The cable 2 includes a plurality of (six in this example) coaxial wires 20a to 20f (an example of the electric wire for differential transmission), a plurality of (two in this example) insulated wires 21a and 21b for supplying power, and a cable jacket 22 covering these wires. In the cable 2, the coaxial wires 20a and 20b, the coaxial wires 20c and 20d, and the coaxial wires 20e and 20f are used as pairs of differential transmission paths. As the coaxial wires 20a to 20f, for example, coaxial wires of American Wire Gauge (AWG) 28 to 40 are used.

The coaxial wires 20a to 20f and the insulated wires 21a and 21b are exposed from the cable jacket 22 at the end portion of the cable 2, and are bundled by, for example, a bundling portion 23.

The bundling portion 23 also has a function of fixing the cable 2 to the housing 50.

The exposed coaxial wires 20a to 20f are in a state in which a center conductor 24, an insulator 25, and an outer conductor 26 are exposed in a stepwise manner from a tip end. The exposed insulated wires 21a and 21b are in a state in which a jacket of a tip end portion is peeled to expose a conductor 27.

Figure 3:
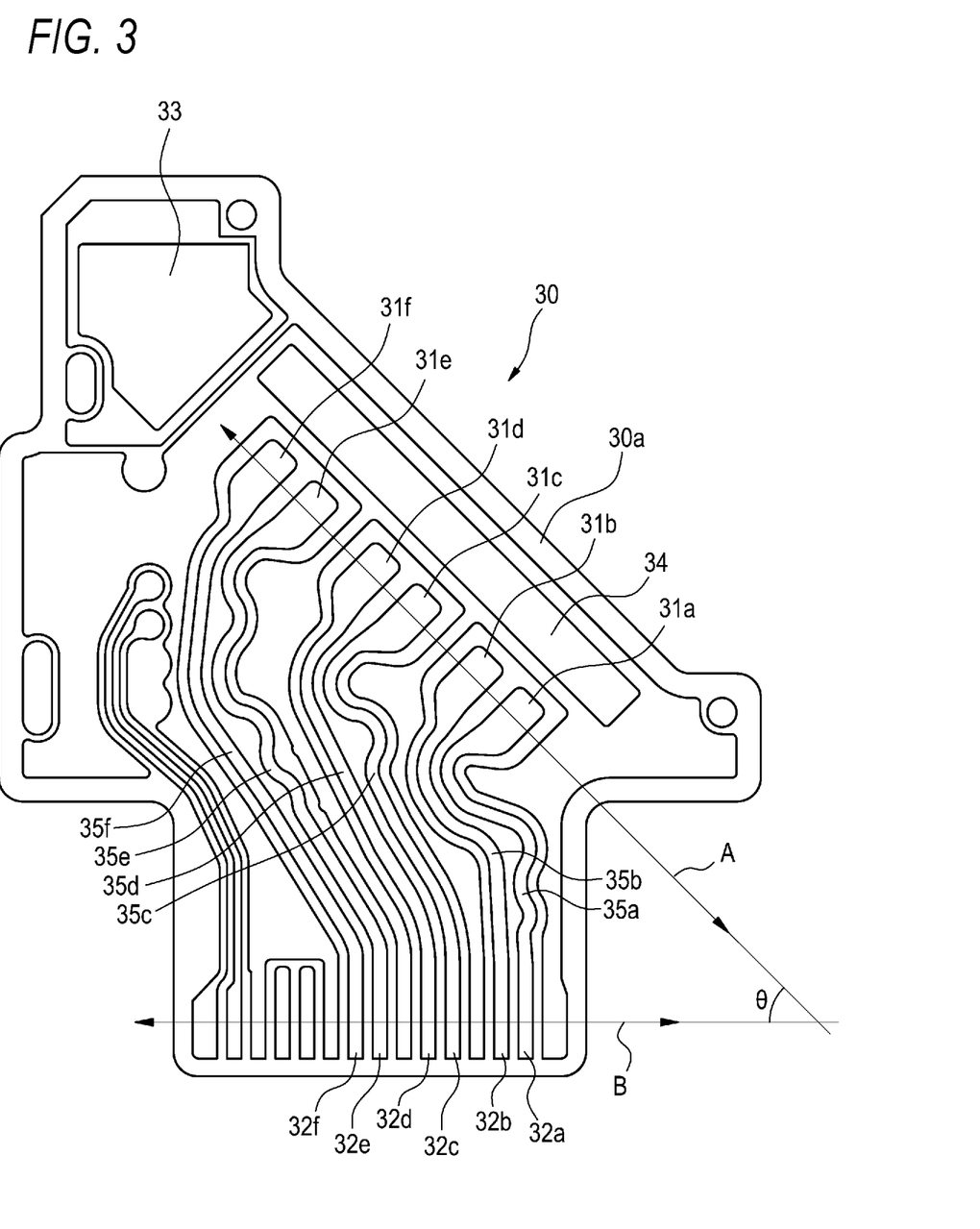
FIG. 3 is a view illustrating a front surface side of a relay circuit board according to an embodiment of the present disclosure.

FIG. 3 is a view illustrating a front surface side of the relay circuit board according to the present embodiment.

As illustrated in FIG. 3, a plurality of (six in this example) wire pads 31a to 31f (an example of a first pad), a plurality of (six in this example) connector pads 32a to 32f (an example of a second pad), and a power supply pad 33 are formed on a front surface 30a of the relay circuit board 30. The wire pads 31a to 31f are pads to which the coaxial wires 20a to 20f of the cable 2 are respectively connected. The connector pads 32a to 32f are pads to which the connector terminals 52 of the connection portions 51a are respectively connected. The power supply pad 33 is a pad to which the insulated wires 21a and 21b of the cable 2 are connected.

A circuit pattern of wirings 35a to 35f connecting the wire pads 31a to 31f and the connector pads 32a to 32f are formed on the front surface of the relay circuit board 30. Meander wirings are applied to the wirings 35a to 35f to make wirings of each of the coaxial wire pairs for differential transmission, that is, the coaxial wires 20a and 20b, the coaxial wires 20c and 20d, and the coaxial wires 20e and 20f, equal in length. In this example, in order to make the wirings of the coaxial wires 20a and 20b equal in length, the meander wiring is applied to the wiring 35a. Similarly, in order to make the wirings of the coaxial wires 20c and 20d equal in length, the meander wiring is applied to the wiring 35c, and in order to make the wirings of the coaxial wires 20e and 20f equal in length, the meander wiring is applied to the wiring 35e.

The wire pads 31a to 31f are arranged in parallel in a certain direction (a direction indicated by an arrow A in this example) on the front surface of the relay circuit board 30. Similarly, the connector pads 32a to 32f are arranged in parallel in a direction indicated by an arrow B. The parallel direction (a second direction) of the connector pads 32a to 32f indicated by the arrow B is inclined at an angle $\theta$ greater than 0 degree and smaller than 90 degree with respect to the parallel direction (a first direction) of the wire pads 31a to 31f indicated by the arrow A.

The inclination angle $\theta$ is preferably 30 degrees or greater and 60 degrees or smaller. Specifically, the inclination angle $\theta$ is set to, for example, 30 degrees, 45 degrees, 60 degrees, or the like. In this example, the inclination angle $\theta$ is set to 45 degrees.

Further, the power supply pad 33 is connected to a back surface of the relay circuit board 30 via a through hole, and is connected to a circuit pattern of a power supply formed on the back surface. Accordingly, since the power supply wiring and the circuit pattern of the wirings 35a to 35f are spaced apart from each other in a thickness direction of the substrate, an effect of noise on high-speed signals transmitted by the wirings 35a to 35f is prevented, and the relay circuit board 30 can be reduced in size.

In the cable 1 with connectors, the cable 2 is led out from a rear portion of the housing 50 in FIG. 2 in a state in which the coaxial wires or the like are covered by the cable jacket 22 (a bundled state). Further, an end portion of the cable 2 including the exposed portions of the coaxial wires 20a to 20f and the insulated wires 21a and 21b and the portions bundled by the bundling portion 23 is provided in the housing 50.

As illustrated in FIGS. 2 and 3, in the coaxial wires 20a to 20f in the housing 50, the exposed center conductors 24 of the respective coaxial cables are connected to the wire pads 31a to 31f of the relay circuit board 30 by soldering. Similarly, the exposed outer conductors 26 are connected to the ground pad 34 of the relay circuit board 30 by soldering.

The end portion of the cable 2 and the relay circuit board 30 that are provided in the housing 50 are fixed with respect to the housing 50. The relay circuit board 30 is fixed such that the parallel direction of the connector pads 32a to 32f is the same as the led-out direction of the cable 2 from the housing 50. Further, the relay circuit board 30 is fixed such that the parallel direction of the connector pads 32a to 32f is the same direction as the parallel direction of the connector terminals 52 in the connection portion 51a.

Figure 4:
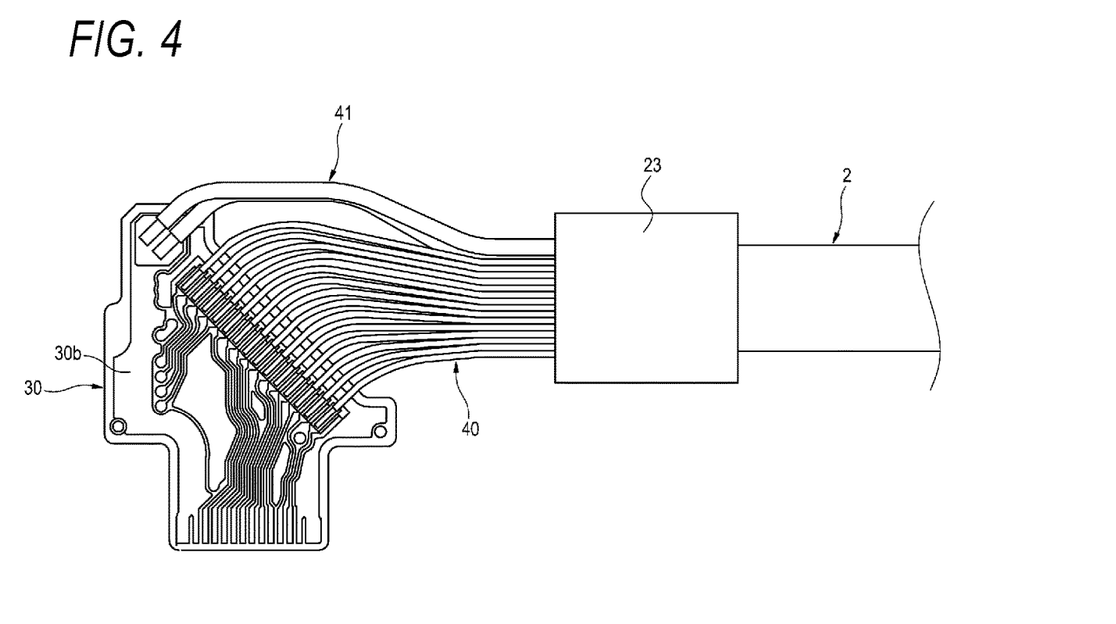
FIG. 4 is a view of an interior of the connector at one end of the cable with connectors of FIG. 1 as viewed from a back surface side.

As described above, the cable 2 includes the plurality of differential transmission coaxial wires 20a to 20f for transmitting high-speed signals, and the insulated wires 21a and 21b for supplying power, and may include, for example, insulated wires for low-speed signal transmission. In the present embodiment, as illustrated in FIG. 4, insulated wires 40 for low-speed signal transmission are connected to a back surface 30b of the relay circuit board 30. Insulated wires 41 are wires for supplying power.

In the present embodiment, the plurality of coaxial wires 20a to 20f for differential transmission are connected to the front surface 30a of the relay circuit board 30 as illustrated in FIG. 2, and the plurality of insulated wires 40 for low-speed signal transmission are connected to the back surface 30b of the relay circuit board 30 as illustrated in FIG. 4. In the above configuration, the differential transmission wirings for transmitting high-speed signals and the wirings for transmitting low-speed signals are not mixed on the same surface of the relay circuit board 30. As a result, it is possible to prevent electrical interference such as crosstalk between the wirings for transmitting low-speed signals and the wirings for transmitting the high-speed signals, and mixing of noise.

On the contrast, when the wirings for transmitting the high-speed signals and the wirings for transmitting the low-speed signals are mixed, it is necessary to greatly increase a distance between the wirings in order to prevent the above-described electrical interference. In the present embodiment, since the wirings are not mixed on the same surface of the relay circuit board 30, there is no need for a region to separate the distance between the wirings. As a result, since the area of the relay circuit board 30 is not increased, the relay circuit board 30 can be reduced in size.

When the relay circuit board 30 is formed as a multilayer substrate, the circuit pattern of the power supply may be formed on an inner layer of the substrate. In this case, an area of the circuit pattern of the power supply can be increased. As a result, the effect of noise can be further prevented by an effect such as decrease in impedance of the power supply. Further, since the area of the circuit pattern of the power supply on the surface of the relay circuit board 30 is small, the relay circuit board 30 can be further reduced in size.

For example, when a wire for low-speed signal transmission is not used, the coaxial wires for differential transmission may be connected to the front surface and the back surface of the relay circuit board 30.

Although a pair of coaxial wires is used as the electric wire for differential transmission, the present disclosure is not limited to this example. For example, as the electric wire for differential transmission, twisted pair wires, or the like may be used in which two insulated wires are twisted together to form a pair and a periphery thereof is shielded by a shield layer.

The relay circuit board 30 can also be used in the straight connector 3B. In this case, the relay circuit board 30 is disposed in a housing of the connector 3B such that the connector pads 32a to 32f are on a connection portion 51b side.

However, it is preferable that the relay circuit board 30 disposed in the housing of the straight connector 3B is set such that the inclination angle θ is small.

Next, a difference between the cable with connectors according to the present embodiment and a cable with connectors of a comparative example will be described with reference to FIG. 5.

Figure 5:
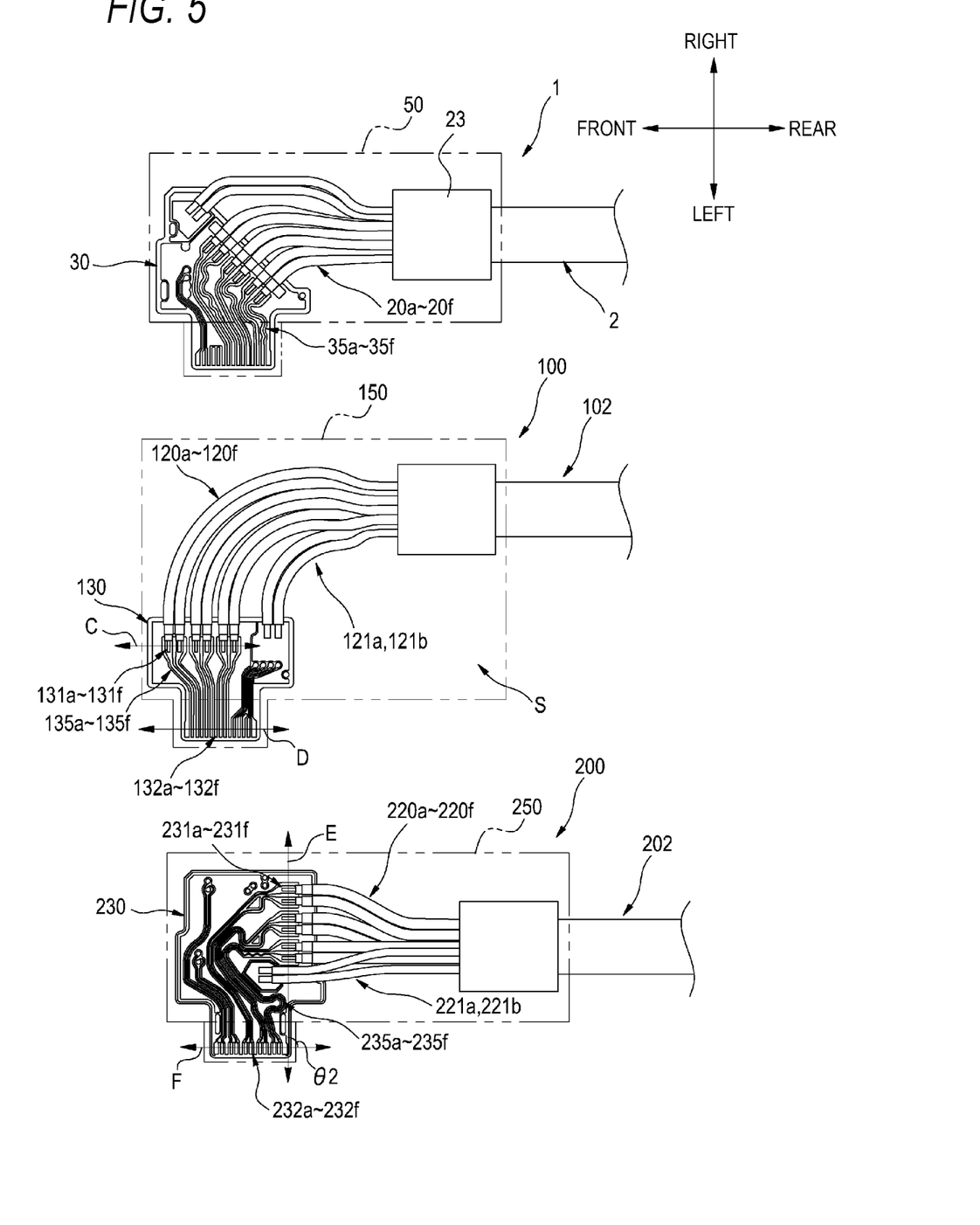
FIG. 5 illustrates a difference between the cable with connectors according to the embodiment of the present disclosure and a cable with connectors of a comparative example.

In FIG. 5, the cable with connectors according to the present embodiment is shown at an upper part, a cable 100 with connectors of Comparative Example 1 is shown at a middle part, and a cable 200 with connectors of Comparative Example 2 is shown at a lower part.

In the cable 100 with connectors of Comparative Example 1, coaxial wires 120a to 120f of a cable 102 are respectively connected to wire pads 131a to 131f of a relay circuit board 130. Wirings 135a to 135f are respectively connected between the wire pads 131a to 131f and connector pads 132a to 132f. The relay circuit board 130 is configured such that a parallel direction (a direction indicated by an arrow D) of the connector pads 132a to 132f is parallel to a parallel direction (a direction indicated by an arrow C) of the wire pads 131a to 131f (an inclination angle is 0 degree). Therefore, since the wirings 135a to 135f are linearly wired, wire lengths of a pair of wirings for differential transmission are substantially the same. Insulated wires 121a and 121b are wires for power supply.

However, in the case of the cable 100 with connectors of Comparative Example 1, the coaxial wires 120a to 120f exposed from the cable 102 need to be bent by 90 degrees so as to be connected to the wire pads 131a to 131f. Further, the insulated wires 121a and 121b for power supply also needs be bent by 90 degrees. Therefore, a curved portion of each wire is long, a large dead space S is generated in a housing 150 of the connector, and a width of the housing 150 in a left-right direction is increased.

In the cable 200 with connectors of Comparative Example 2, coaxial wires 220a to 220f of a cable 202 are connected to wire pads 231a to 231f of a relay circuit board 230, respectively. Insulated wires 221a and 221b are wires for power supply. Wirings 235a to 235f are respectively connected between the wire pads 231a to 231f and connector pads 232a to 232f. Further, the relay circuit board 230 is configured such that a parallel direction (a direction indicated by an arrow F) of the connector pads 232a to 232f is perpendicular to a parallel direction (a direction indicated by an arrow E) of the wire pads 231a to 231f (an inclination angle θ2 is 90 degrees).

Therefore, the connector pads 232a to 232f and the wire pads 231a to 231f are formed at positions away from each other, for example, as compared with the case of the cable 100 with connectors. Wiring directions of the wirings 235a to 235f are bent by 90 degrees from the wire pads 231a to 231f to the connector pads 232a to 232f. When the wirings are bent by 90 degrees as described above, since a wire length difference is generated between a pair of wirings for differential transmission, meander wirings are applied to the wirings 235a to 235f to absorb the wire length difference. Further, since the wirings 235a to 235f are wirings for transmitting high-speed signals, the wirings 235a to 235f cannot be formed into a shape having a sharp bend. Therefore, an area of the relay circuit board 230 increases as a region where the meander wiring is applied increases. As a result, a length of the connector in a front-rear direction of a housing 250 is long.

Meanwhile, according to the cable 1 with connectors of the present embodiment, in the relay circuit board 30, the parallel direction of the wire pads 31a to 31f is configured to be inclined at an angle greater than 0 degree and smaller than 90 degrees with respect to the parallel direction of the connector pads 32a to 32f. Therefore, in the housing 50 of the connector 3A, the coaxial wires 20a to 20f exposed from the cable 2 can be connected to the wire pads 31a to 31f without being bent as much as possible. Therefore, since it is possible to reduce the wire length difference in wirings of each pair of coaxial wires 20a and 20b, 20c and 20d, and 20e and 20f configuring the coaxial cable pair for differential transmission, so that a region on which the meander wiring for absorbing the wire length difference is formed can be reduced as much as possible. Therefore, the dead space in the housing 50 can be reduced while eliminating the wire length difference between a pair of wirings for differential transmission without increasing the area of the relay circuit board 30 as much as possible. Further, increase in length of the wirings 35a to 35f can be prevented, and a high transmission quality of the high-speed signals can be maintained. Therefore, in the cable 1 with connectors including the right-angle connector 3A in which the direction in which the plurality of connector terminals 52 are arranged in parallel and the direction in which the cable 2 is led out from the housing 50 are the same direction, the connector 3A can also be reduced in size.

In the relay circuit board 30 and the electric wire for differential transmission with a relay circuit board 10 of the present embodiment, similarly, the wire length difference between a pair of wirings for differential transmission can also be eliminated without increasing the area of the relay circuit board 30 as much as possible. Therefore, the dead space in the connector generated when the relay circuit board 30 is used in the connector can be reduced.

Further, in the relay circuit board 30, the inclination angle of the parallel direction of the wire pads 31a to 31f with respect to the parallel direction of the connector pads 32a to 32f may be 30 degrees or greater and 60 degrees or smaller. Thus, the design of the wirings 35a to 35f can be further facilitated while reducing the dead space in the housing 50. Therefore, the manufacturing of the relay circuit board 30 can be further facilitated.

Although the present disclosure has been described in detail and with reference to specific embodiments, it is obvious to those skilled in the art that various changes and modifications can be made without departing from the spirit and scope of the present disclosure. The numbers, positions, shapes or the like of components described above are not limited to the above embodiments, and can be changed to suitable numbers, positions, shapes, or the like while carrying out the present disclosure.

What is claimed is:

1. A relay circuit board, comprising:
a plurality of first pads arranged in parallel in a first direction;
a plurality of second pads arranged in parallel in a second direction; and
wirings connecting the plurality of first pads and the plurality of second pads, respectively, wherein:
one or more of the wirings are provided in a bent state in a meandering manner,
the second direction is inclined at a predetermined angle with respect to the first direction,
the predetermined angle is greater than 0 degree and smaller than 90 degrees,
the one or more of the wirings include differential transmission line formed by a pair of a first wiring and a second wiring which are adjacent to each other,
a distance from one of the first pads connected to the first wiring to one of the second pads connected to the first wiring is shorter than a distance from another of the first pads connected to the second wiring to the one of the second pads, in the first direction, and
the first wiring is more meandering than the second wiring.

2. The relay circuit board according to claim 1, wherein the predetermined angle is 30 degrees or greater and 60 degrees or smaller.

3. An electric wire for differential transmission with a relay circuit board, compressing:
a relay circuit board including a plurality of first pads arranged in parallel in a first direction, a plurality of second pads arranged in parallel in a second direction, and wirings connecting the plurality of first pads and the plurality of second pads, respectively; and
a plurality of electric wires for differential transmission, wherein:
the plurality of electric wires for differential transmission are respectively connected to the plurality of first pads,
one or more of the wirings of the relay circuit board, which connect the plurality of first pads and the plurality of second pads, respectively, are provided in a bent state in a meandering manner,
the second direction is inclined at a predetermined angle with respect to the first direction, and the predetermined angle is greater than 0 degree and smaller than 90 degrees,
the one or more of the wirings include differential transmission line formed by a pair of a first wiring and a second wiring which are adjacent to each other,
a distance from one of the first pads connected to the first wiring to one of the second pads connected to the first wiring is shorter than a distance from another of the first pads connected to the second wiring to the one of the second pads, in the first direction, and
the first wiring is more meandering than the second wiring.

4. A cable with a connector, comprising:
a connector; and
a cable, wherein:
the connector includes:
a relay circuit board including a plurality of first pads arranged in parallel in a first direction, a plurality of second pads arranged in parallel in a second direction, and wirings connecting the plurality of first pads and the plurality of second pads, respectively;
a housing accommodating the relay circuit board; and
a plurality of connector terminals arranged in parallel in the second direction, wherein the plurality of second pads are connected to the plurality of connector terminals,
the cable includes
a plurality of electric wires for differential transmission, and is led out from the housing in a state in which the plurality of electric wires for differential transmission are bundled,
the plurality of electric wires for differential transmission are respectively connected to the plurality of first pads, the second direction is inclined at a predetermined angle with respect to the first direction, the predetermined angle is greater than 0 degree and smaller than 90 degrees, the second direction and the direction in which the cable is led out from the housing are the same direction, the wirings include differential transmission line formed by a pair of a first wiring and a second wiring which are adjacent to each other, a distance from one of the first pads connected to the first wiring to one of the second pads connected to the first wiring is shorter than a distance from another of the first pads connected to the second wiring to the one of the second pads, in the first direction, and the first wiring is more meandering than the second wiring.

5. The cable with the connector according to claim 4, wherein the predetermined angle is 30 degrees or greater and 60 degrees or smaller.

6. A cable with a connector, comprising:
a connector; and
a cable, wherein:
the connector includes:
a relay circuit board including a plurality of first pads arranged in parallel in a first direction, a plurality of second pads arranged in parallel in a second direction, and wirings connecting the plurality of first pads and the plurality of second pads, respectively;
a housing accommodating the relay circuit board; and
a plurality of connector terminals arranged in parallel in the second direction, wherein the plurality of second pads are connected to the plurality of connector terminals,
the cable includes
a plurality of electric wires for differential transmission, and is led out from the housing in a state in which the plurality of electric wires for differential transmission are bundled, the plurality of electric wires for differential transmission are respectively connected to the plurality of first pads, one or more of the wirings of the relay circuit board, which connect the plurality of first pads and the plurality of second pads, respectively, are provided in a bent state in a meandering manner, the second direction is inclined at a predetermined angle with respect to the first direction, the predetermined angle is greater than 0 degree and smaller than 90 degrees, the relay circuit board includes a connector portion which is exposed and protrudes from the housing in a lateral direction of the cable led out from the housing, the plurality of the connector terminals is disposed on the connector portion, the one or more of the wirings include differential transmission line formed by a pair of a first wiring and a second wiring which are adjacent to each other, a distance from one of the first pads connected to the first wiring to one of the second pads connected to the first wiring is shorter than a distance from another of the first pads connected to the second wiring to the one of the second pads, in the first direction, and the first wiring is more meandering than the second wiring.

7. The cable with the connector according to claim 6, wherein the predetermined angle is 30 degrees or greater and 60 degrees or smaller.

8. The cable with the connector according to claim 6, wherein:
the plurality of electric wires for differential transmission is connected to the plurality of the first pads in a third direction which is perpendicular to the first direction and inclined at a given angle with respect to the second direction, and the given angle is greater than 0 degree and smaller than 90 degrees.

* * * * *